(12) United States Patent
Lindfors et al.

(10) Patent No.: US 6,438,366 B1
(45) Date of Patent: *Aug. 20, 2002

(54) METHOD AND CIRCUIT FOR SAMPLING A SIGNAL AT HIGH SAMPLING FREQUENCY

(75) Inventors: Saska Lindfors, Espoo; Aarno Pärssinen; Kari Halonen, both of Helsinki, all of (FI)

(73) Assignee: Nokia Mobile Phones Limited, Espoo (FI)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/316,357

(22) Filed: May 21, 1999

(30) Foreign Application Priority Data

May 29, 1998 (FI) .................................................. 981209

(51) Int. Cl.[7] .............................................. H03H 17/02
(52) U.S. Cl. ....................... 455/334; 455/295; 455/296; 330/258; 330/259; 375/350
(58) Field of Search ................................ 455/334, 130, 455/295–299, 304, 311, 312, 337; 375/350, 319, 286; 330/259, 258, 311; 337/91, 95, 96; 341/143, 155, 118; 364/825, 724, 807, 829; 333/165–167

(56) References Cited

U.S. PATENT DOCUMENTS

| | | | | |
|---|---|---|---|---|
| 4,253,067 A | * | 2/1981 | Caples et al. ................ | 329/306 |
| 4,653,017 A | | 3/1987 | Colbeck et al. ............. | 364/825 |
| 4,970,637 A | * | 11/1990 | Sato ........................... | 708/207 |

(List continued on next page.)

FOREIGN PATENT DOCUMENTS

EP        0 813 338 A2    12/1997

OTHER PUBLICATIONS

"Cascade Switched–Capacitor IIR Decimating Filters", Martins et al., IEEE Transactions On Circuits And Systems I: Fundamental Theory and Applications, vol. 42, No. 7, pp. 367–376.

"IIR Double–Sampled Switched–Capacitor Building Blocks for High–Frequency Decimators", A. Baschirotto, IEEE, Analog, Circuits and Neural Networks, vol. 3, No. Symp. 24, pp. 1673–1676.

"A New Architecture for Bandpass Sigma Delta Analogue to Digital Conversion" Keady et al., IEE Colloquium On Oversampling And Sigma–Delta Strategies For DSP, Digest No. 1995/217, pp. 8/1–4.

"A 900–Mhz RF Front–End with Integrated Discrete–Time Filtering", IEEE Journal of Solid–State Circuits, vol. 31, No. 12, pp. 1945–1996.

*Primary Examiner*—Daniel Hunter
(74) *Attorney, Agent, or Firm*—Perman & Green, LLP

(57) ABSTRACT

Electrical circuit (300, 500, 800, 900) has an input (301, 501, 801, 802, 901, 902) and an output (311, 502, OUT, I-OUT, Q-OUT). The circuit samples an input signal coupled to the input having a certain input frequency and converts the input signal into a certain output frequency at the output, the output frequency being lower than the input frequency. It comprises a first sampler circuit (302, 510, 803, 910) coupled to the input, a second sampler circuit (303, 520, 804, 920) coupled to the input, a buffering component (309, 509, 809, 903, 904) coupled to the output and buffer switching means (305–307, 514, 515, 811–818, 914, 915, 924, 925, 934, 935, 944, 945, 954, 955, 964, 965, 974, 975, 984, 985).

The buffer switching means are arranged to respond to a buffering command ($f_s/N$, A, B) by coupling said first sampler circuit and said second sampler circuit to said buffering component.

21 Claims, 8 Drawing Sheets

U.S. PATENT DOCUMENTS

| | | | | |
|---|---|---|---|---|
| 5,134,403 | A | | 7/1992 | Rush .......................... 341/159 |
| 5,162,723 | A | | 11/1992 | Marzalek ................. 324/77 B |
| 5,191,331 | A | | 3/1993 | Karema et al. ............. 341/131 |
| 5,194,826 | A | | 3/1993 | Huusko ...................... 330/302 |
| 5,248,972 | A | | 9/1993 | Karema et al. ............. 341/143 |
| 5,303,404 | A | | 4/1994 | Kivela ..................... 455/200.1 |
| 5,311,179 | A | | 5/1994 | Vaisanen et al. ............ 341/118 |
| 5,331,321 | A | | 7/1994 | Mannonen ................. 341/110 |
| 5,396,657 | A | | 3/1995 | Jokinen ...................... 455/307 |
| 5,473,275 | A | * | 12/1995 | Hughes et al. ............. 327/336 |
| 5,691,720 | A | * | 11/1997 | Wang et al. ................ 341/143 |
| 5,701,106 | A | | 12/1997 | Pikkarainen et al. ........ 332/110 |
| 5,731,772 | A | | 3/1998 | Mikkola et al. ............ 341/118 |
| 5,734,683 | A | | 3/1998 | Hulkko et al. .............. 375/316 |
| 5,786,782 | A | | 7/1998 | Ostman et al. ............. 341/141 |
| 5,809,399 | A | | 9/1998 | Tuutijarvi et al. ............ 455/63 |
| 5,909,131 | A | * | 6/1999 | Singer et al. ................. 327/91 |
| 5,914,638 | A | * | 6/1999 | He ............................... 330/258 |
| 5,917,867 | A | * | 6/1999 | Sokoler ....................... 375/350 |
| 6,037,887 | A | * | 3/2000 | Wu et al. .................... 341/143 |
| 6,061,008 | A | * | 5/2000 | Abbey ........................ 341/143 |
| 6,100,834 | A | * | 8/2000 | Lewyn ........................ 341/155 |
| 6,194,940 | B1 | * | 2/2001 | Hunter et al. ............... 327/298 |
| 6,215,337 | B1 | * | 4/2001 | Bazarjani ..................... 327/91 |
| 6,243,430 | B1 | * | 6/2001 | Mathe ........................ 375/346 |

* cited by examiner

METHOD AND CIRCUIT FOR SAMPLING A SIGNAL AT HIGH SAMPLING FREQUENCY

TECHNOLOGICAL FIELD

The invention relates generally to the technique of taking discrete samples from a signal, like a received signal at a radio frequency or intermediate frequency in a receiver. Especially the invention relates to reducing the inherent aliasing of noise in the sampling process.

BACKGROUND OF THE INVENTION

A transmitted radio signal contains some information modulated onto a radio frequency carrier. A multitude of radio receiver architectures are known for receiving the transmitted radio frequency signal and downconverting the received signal into baseband where the information content of the signal may be reconstructed. It is common to use a superheterodyne receiver which converts the received signal first into an intermediate frequency (IF), where some amplification and filtering is performed, and to apply a second downconversion from IF to baseband. Previously a direct conversion receiver has been proposed for reducing power consumption and decreasing the space taken by the components of the radio receiver.

FIG. 1 illustrates a known direct conversion receiver 100, where a radio frequency signal picked up by the antenna 101 is filtered in a band pass filter 102, which is also called a preselection filter, and amplified in a Low Noise Amplifier (LNA) or preamplifier 103 before mixing it into baseband simultaneously in two parallel mixers 104 and 105. The mixers share a common local oscillator (LO) 106 but the LO signal is phase shifted by $\pi/2$ radians in a phase shifter 107 before feeding it into one of the mixers to produce a pair of mutually phase shifted mixing results called the I and Q signals. The mixing result from each mixer is filtered in a low pass filter 108 or 109 before converting it into a stream of digital samples in an analogue to digital (A/D) converter 110 or 111.

The drawbacks of the arrangement of FIG. 1 are its inferior sensitivity compared to that of a corresponding superheterodyne receiver and LO leakage owing to the fact that the LO frequency is situated in the operational frequency band of the Low Noise Amplifier 103 and the preselection filter 102.

FIG. 2 illustrates an alternative approach 200 to downconversion into baseband, known as subsampling. A radio frequency signal or an intermediate frequency signal is conducted along an input line 201 through a bandpass filter 202 to the input of a switch 203. The output of the switch is coupled to the input of an amplifier 204 and to a capacitor 205, the other end of the latter being connected to a reference potential, which is usually ground potential. The control signal 206 that controls the state of the switch 203 is a square wave coming from a local oscillator at a frequency which is either an integral multiple or a subharmonic of the radio frequency being downconverted. The frequency of the control signal is called the clock frequency or sampling frequency. The amplifier 204 acts as an output buffer. The arrangement of switch 203 and capacitor 205 is generally called an "switched-capacitor sampler" and will be denoted as an "SC sampler" from here on. The buffered output of an SC sampler on line 207 is a baseband signal. During the time interval when switch 203 is closed the SC sampler is said to be in tracking mode and during the time interval when switch 203 is open the SC sampler is said to be in hold mode.

One of the problems in an arrangement according to FIG. 2 is the limited speed of the amplifier 204. It is commonplace to use a CMOS amplifier because of the advantageous features inherent to CMOS technology. However, a known CMOS amplifier (when driven at a reasonable power level) is so slow to react to the changes in its input that the clock frequency of the arrangement must remain below 100 MHz. The SC sampler itself (the combination of a controllable switch and a capacitor) could operate at a much higher clock frequency.

The consequences of a relatively low sampling frequency are seen in the noise figure of the arrangement. The total noise figure $NF_{TOT}$ of a receiver front-end comprising an LNA and a subsampling arrangement according to FIG. 2 can be expressed as $$NF_{TOT} = \frac{B_N}{f_N} NF_{LNA} + \frac{NF_{mix} - 1}{G_{LNA}}, \qquad (1)$$

where $B_n$ is the equivalent noise bandwidth at the LNA output, $f_n$ is the Nyquist frequency of the sampler, $NF_{LNA}$ is the noise figure of the LNA, $NF_{mix}$ is the noise figure of the subsampling arrangement (also known as the subsampling mixer) and $G_{LNA}$ is the gain factor of the LNA. The first term in, (1) shows that to minimize the noise figure it is advantageous to limit the bandwidth before the sampler and maximize the sampling frequency. However, in an integrated circuit it may often be impossible or expensive to reduce $B_n$ sufficiently to prevent noise aliasing. In the second term of (1) the factor $NF_{mix}$ depends on the sampling frequency according to the formula $$NF_{mix} = 1 + \frac{1}{4C_h R_S f_N}, \qquad (2)$$

where $C_h$ is the capacitance of the sampling capacitor and $R_S$ is the source resistance of the subsampling mixer. In the derivation of (2) the usual assumption was made that the total noise power may be expressed as $kT/C_h$. Although $NF_{mix}$ is typically high for subsampling mixers, it may be noted from equation (1) that it is divided by the preceding gain and therefore presents no fundamental limitation.

When a very fast slewing signal is sampled, the dynamic range of the subsampling mixer is degraded by timing uncertainty in the clock frequency. It can be shown that in the sampling-based conversion of a signal with frequency f, a jitter referenced to as $t_j$ limits the Signal-to-Noise Ratio (SNR) to $$SNR = 10 \cdot \log_{10}\left[\frac{OSR}{(2\pi f)^2 t_j^2}\right], \qquad (3)$$

where the oversampling ratio OSR is defined as the ratio between the signal bandwidth and the sampler Nyquist frequency. Oversampling data converters are insensitive to jitter because their OSR is high and the signal frequency f is respectively low. On the contrary, a subsampling mixer always sees a relatively high input frequency f; increasing the sampling rate nevertheless reduces the effect of timing jitter because OSR is thus increased.

SUMMARY OF THE INVENTION

It is an object of the present invention to bring forward a method and a circuit for downconverting an oscillating signal, the noise characteristics of the circuit being better than those of prior art solutions. A further object of the invention is that the presented method would be equally applicable to direct downconversion from radio frequency and to downconversion from intermediate frequency. A still further object if the invention is that the resulting circuit is efficient in terms of pwer consumption.

The objects of the invention are achieved by placing at least two SC samplers in parallel and using an amplifier to simultaneously buffer the outputs of the parallel SC samplers.

The electrical circuit according to the invention has an input and an output and is meant for sampling an input signal coupled to the input having a certain input frequency and converting the input signal into a certain output frequency at the output, the output frequency being lower than the input frequency. It is characterised in that it comprises a first sampler circuit coupled to the input, a second sampler circuit coupled to the input, a buffering component coupled to the output and buffer switching means arranged to respond to a buffering command by coupling said first sampler circuit and said second sampler circuit to said buffering component.

The invention also concerns a receiver which is characterised in that it comprises in a sampling downconverter block:

a first sampler circuit coupled to the input of the sampling downconverter block, a second sampler circuit coupled to the input of the sampling downconverter block, a buffering component coupled to the output of the sampling downconverter block and buffer switching means arranged to respond to a buffering command by coupling said first sampler circuit and said second sampler circuit to said buffering component.

Additionally the invention concerns a method for sampling and downconverting a signal. The method according to the invention is characterised in that it comprises the steps of taking a first sample from the input signal during a first sampling time interval and holding said first sample, taking a second sample from the input signal during a second sampling time interval, which is later in time than said first sampling time interval, and holding aid second sample, taking a combination of said held first sample and said held second sample and buffering said combination in an output buffer.

As mentioned earlier, an SC sampler is capable of operating at a much higher clock frequency than what a conventional buffering CMOS amplifier tolerates. An obvious solution to this incongruity would be to use a more elaborate amplifier or some other trick to enhance the frquency tolerance of the amplifier. However, this would easily result in large amounts of power being used in the amplifier, giving rise to temperature problems and untolerably high consumption of energy. The latter is a very serious drawback in battery-powered modern mobile radio apparatuses like mobile telephones.

The invention approaches the problem from a totally different viewpoint. If several SC samplers are connected in parallel, a relatively high first clock frequency—for example in the order of several hundreds of MHz—may be used to Digger the sampling event in each SC sampler at a different moment of time. A time period during which exactly one clock pulse will be given to each one of the parallel SC samplers is called a sampling cycle. A second clock frequency is a fraction of the first clock frequency and it is used to couple the parallel SC samplers to a common output buffer (advantageously a buffering amplifier) simultaneously, once during each sampling cycle. The second clock frequency is not higher than what the buffering amplifier can tolerate.

The effect of the invention on the noise characteristics of a subsampling receiver front-end is significant, as can be seen from the formulae presented previously. The sampling frequency that appears in (1)–(3) through the Nyquist frequency $f_n$ is the first clock frequency defined above, which is several times higher than the second clock frequency that is limited by the capabilities of the amplifier or by the power budget of the system. As the Nyquist frequency $f_n$ gets higher, the first term in equation (1) (the term that dominates the noise figure) gets lower and the maximun Signal-to-Noise Ratio SNR limited by the jitter gets higher.

A very advantageous further application of the invention may be presented, in which the polarity of a number of samples is additionally inverted before coupling the samples from the parallel SC samplers to the common buffering amplifier. At the time of filing this patent application it is seen that in the most advantageous embodiment of this further application of the invention, every other sample is inverted. The inversion is especially simple to implement if the signal to be sampled is differential, wherein an inversion corresponds to simply cross-connecting a pair of signal wires. This further application of the invention is applicable e.g. to produce a quasi-direct conversion from radio frequency to baseband, in which the received signal is first converted to IF by sampling and immediately moved to baseband by inverting every other sample.

A buffering amplifier is used throughout this patent application as an example of an output component; however, the parallel SC sampler branches could as well be connected to some other kind of output component, like an A/D converter or a filter or any other signal processing block accepting an SC input. An amplifier is generally an advantageous output component, because it buffers the signal as a voltage and not as a charge, whereby mismatch between the capacitances is not a problem. To avoid confusing multiple definitions for practically the same thing, the component to which the parallel SC sampler branches are connected is generally called a buffering component. Similarly the operation of reading the outputs of the parallel SC sampler branches into the output component is called simply buffering.

BRIEF DESCRIPTION OF THE DRAWINGS

The novel features which are considered as characteristic of the invention are set forth in particular in the appended Claims. The invention itself, however, both as to its construction and its method of operation, together with additional objects and advantages thereof, will be best understood from the following description of specific embodiments when read in connection with the accompanying drawings.

FIGS. 1 and 2 were referred to in the discussion of prior art, so the following explanation will concentrate on FIGS. 3 to 11.

DETAILED DESCRIPTION OF THE INVENTION

Figure 3:
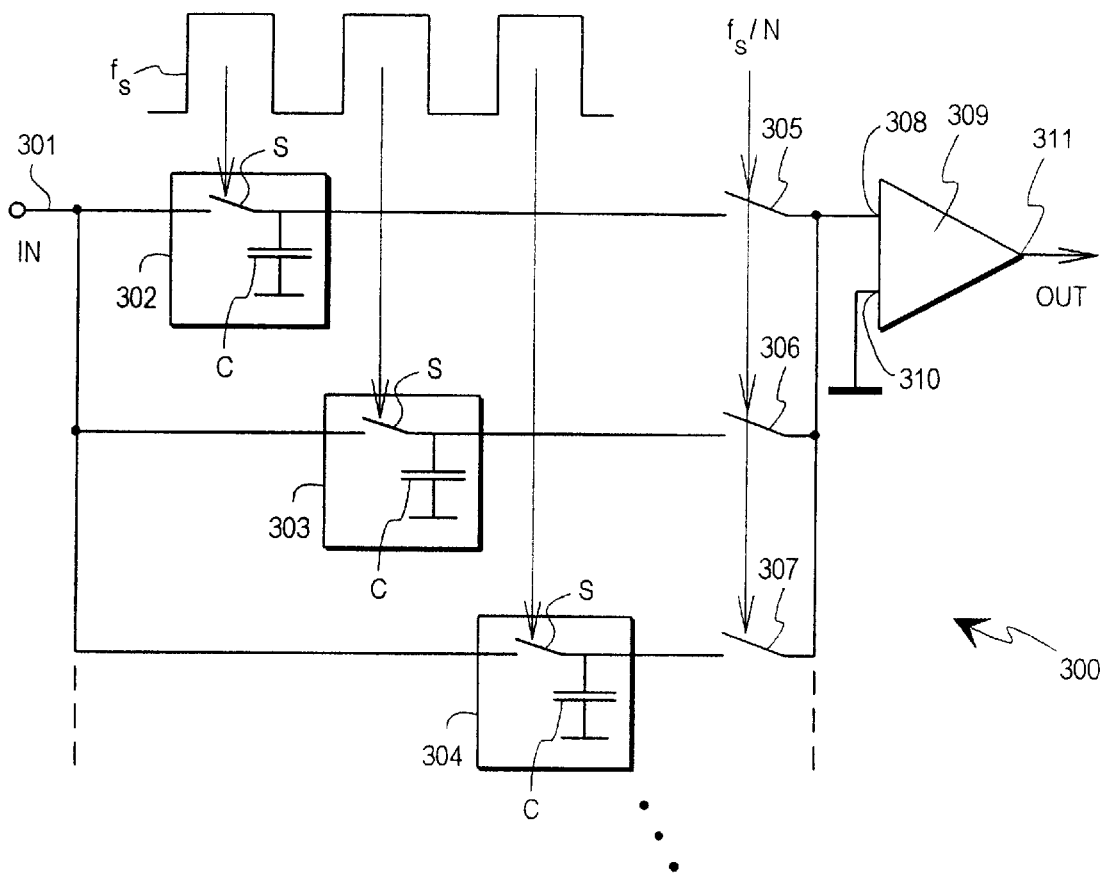
FIG. 3 illustrates an arrangement according to the principle of the invention.

The circuit arrangement 300 of FIG. 3 comprises an input line 301 and N parallel SC samplers, where N is a positive integer; for graphical clarity only three parallel SC samplers 302, 303 and 304 are shown. Consistently with the prior art SC samplers each SC sampler 302 to 304 comprises a controllable switch S and a capacitor C. In the model of an SC sampler used here as an example, the switch S is connected between the input and output of the SC sampler and the capacitor C is connected between the output of the SC sampler and a constant reference potential, which is a usually the local ground potential as shown in FIG. 3. "Controllable switch" is a general denomination to any circuit arrangement between at least one input and at least one output, which has a conductive state and a nonconductive state and which can be selectively driven into one of the states by applying an electrical control signal. The input of each SC sampler is here connected directly to the input line 301 of the whole circuit arrangement. The circuit arrangement further comprises N controllable switches of which only the switches 305, 306 and 307 are shown. Of these N switches, each SC sampler has its own switch connected in series with the output of the SC sampler. Each of the N switches is further coupled to the input 308 of a buffering amplifier 309. The other input 310 of the buffering amplifier 309 is connected to a constant reference potential, here the ground potential. The output 311 of the buffering amplifier 309 is the same as the output of the whole circuit arrangement 300.

To distinguish between the switches S in the SC samplers and the switches between the SC samplers and the buffering amplifier the former may be called sampling switches and the latter may be called buffering switches. A first clock signal f, is used to drive the sampling switches S. Ideally the first clock signal $f_s$ is a square wave signal containing regular consecutive pulses with zero rise time and zero decay time. A clock arrangement, which is not shown in FIG. 3, will arrange the conduction of the pulses of the first clock signal $f_s$ to the sampling switches S so that a first clock pulse will close and open the sampling switch S of the first SC sampler 302, the following second clock pulse will close and open the sampling switch S of the second SC sampler 303 and so on until the N:th clock pulse will close and open the sampling switch of the N:th SC sampler. Thereafter the N+1:th clock pulse will again close and open the sampling switch S of the first SC sampler and so on; in other words the closing and opening of the sampling switches S takes place in cyclical manner with a cycle of N pulses of the first clock signal $f_s$.

A second clock signal $f_s/N$ is used to simultaneously close and open all the N buffering switches connected in series with the outputs of the SC samplers, of which only buffering switches 305, 306 and 307 are shown. As is evident from its designation, the frequency of the second clock signal $f_s/N$ is an integral fraction of the frequency of the first clock signal $f_s$. To put it more exactly, the frequency of the second clock signal $f_s/N$ is obtained by dividing the frequency of the first clock signal $f_s$ by the number of the parallel SC samplers. In other words, as the second clock signal is also ideally a square wave signal containing consecutive pulses, there is one pulse in the second clock signal during each cycle of N pulses in the first clock signal $f_s$. The mutual phasing of the first and second clock signals will be explained in more detail below.

The circuit arrangement of FIG. 3 functions as follows. An oscillating input signal is applied to input line 301 and consequently coupled to the input of each parallel SC sampler. The sampling switch S of the first SC sampler 302 is closed for the duration of one clock pulse of the first clock signal $f_s$, resulting in a first sample of the input signal being taken and stored in the first SC sampler 302. During the next clock pulse of the first clock signal $f_s$ a second sample is taken and stored by the second SC sampler 303 and so on until in the end of the cycle of N pulses a total of N separate samples have been taken and stored in the parallel SC samplers. When all N samples are ready the buffering switches 305, 306, 307 (and all other N−3 buffering switches) are closed simultaneously, causing all the separate samples to be summed together. The sum of all samples is thereby coupled to the first input 308 of the buffering amplifier 309. During the next cycle of N pulses in the first clock signal $f_s$ the output of the amplifier 309 will remain essentially constant, consistently with the buffering role of the amplifier.

A brief re-examination of the formulae (1) and (3) will illustrate the value of the arrangement of FIG. 3 in enhancing the noise characteristics of a subsampling receiver front-end. The total noise figure $NF_{TOT}$ can now be expressed as $$NF_{TOT} = \frac{B_n}{Nf_N}NF_{LNA} + \frac{NF_{mix}-1}{G_{LNA}}, \qquad (4)$$

where the number N of parallel SC samplers now appears in the denominator of the first term (not to be confused with the N's in $NFT_{TOT}$, $NF_{LNA}$ and $NF_{mix}$). The magnitude of the original term $B_n/f_N$ caused by noise aliasing is significantly reduced even for relatively small N. Assuming that the timing jitter is correlated between different SC samplers the formula (3) of the maximum theoretical Signal-to-Noise Ratio may be rewritten as $$SNR_{max} = 10 \cdot \log_{10}\left[N\frac{OSR}{(2\pi f)^2 t_j^2}\right], \qquad (5)$$

showing also an improvement in the Signal-to-Noise Ratio. Neither of the results (4) or (5) depends on the capacitance of the capacitors C in the parallel SC samplers. If we denote the capacitance of the prior art capacitor 205 in FIG. 2 as $C_h$, selecting the capacitance of the capacitors C to be $C_h/N$ will keep the total load capacitance unchanged in the arrangement of FIG. 3, whereby the total power consumption of the buffer amplifier is not affected by the replacement of the prior art single SC sampler with the parallel arrangement according to the invention.

Figure 1:
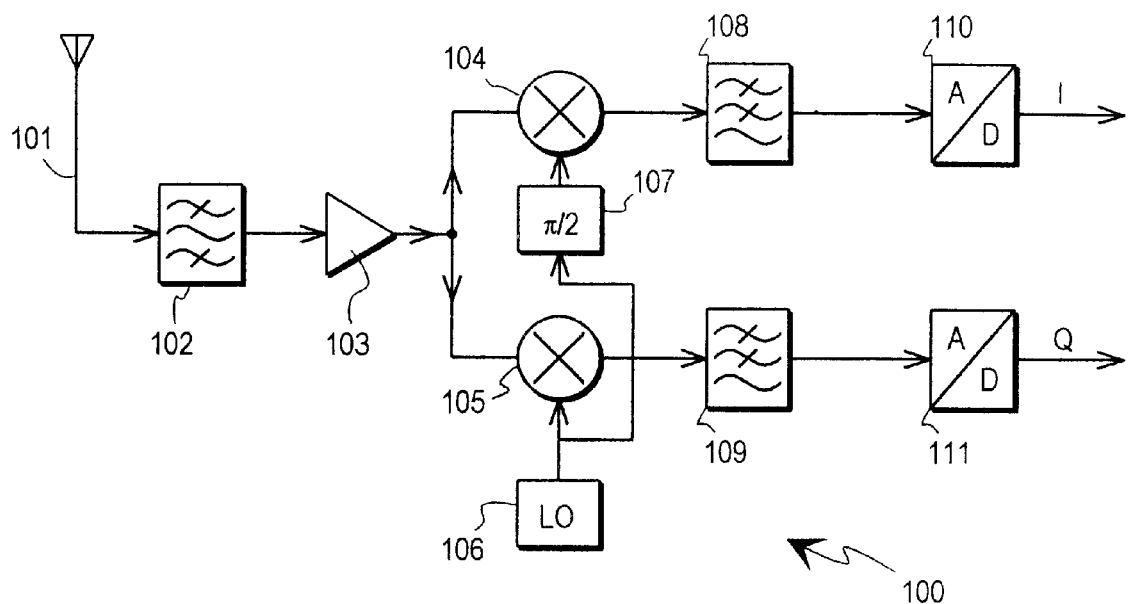
FIG. 1 illustrates a known direct conversion receiver.
Figure 2:
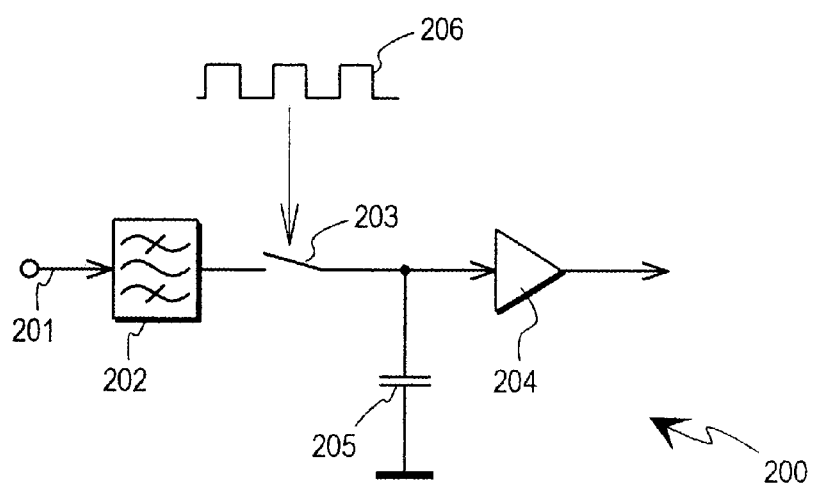
FIG. 2 shows the known principle of subsampling.

The internal noise sources of the N sampling switches are not correlated and their noise contribution is not changed compared to the prior art arrangement. Assuming that the noise power $n^2$ in one unit capacitor C is kT/C, we may write the corresponding charge in N unit capacitors as $$Q_{TOT} = \sqrt{NQ^2} = \sqrt{NC^2 \frac{kT}{C}} = \sqrt{kTNC} \tag{6}$$

and the total noise power in the N capacitors C as $$n_h^2 = \frac{Q_{TOT}^2}{(NC)^2} = \frac{kT}{NC} \tag{7}$$

which is the same as if the sampling was carried out at once into one large hold capacitor with the capacitance $C_h$=NC as in FIG. 2.

Figure 4:
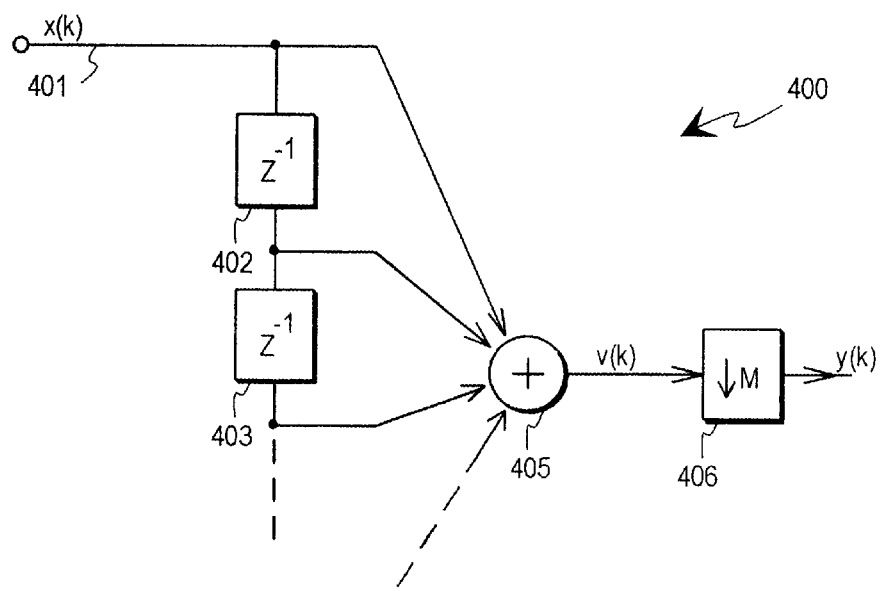
FIG. 4 is a Z-domain representation of the system of FIG. 3 after subsampling has been performed.

FIG. 4 is a Z-domain representation 400 of the arrangement of FIG. 3. Here input point 401 corresponds to input line 301 of FIG. 3 and the N multiplication elements $Z^{-1}$, of which only the two first elements 402 and 403 are shown, correspond to the N parallel SC samplers. The outputs of the multiplication elements are combined in adder 405 and the result of the addition is coupled to the decimator 406 which corresponds to the sample rate reduction in the buffer amplifier 309 of FIG. 3.

Figure 4A:
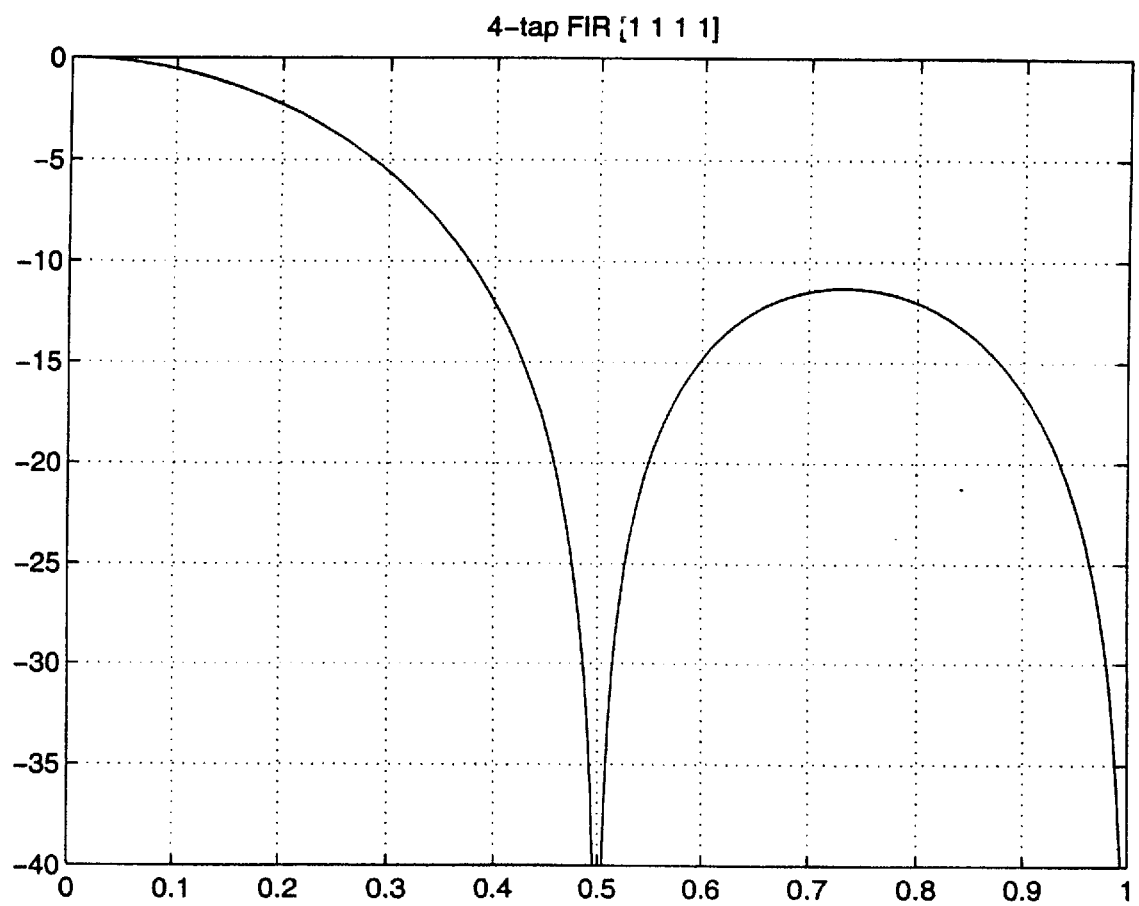
FIG. 4a shows a typical frequency response of the arrangement of FIG. 4.

If the input signal to the system of FIG. 4 is denoted as x(k) and the result after addition in adder 405 is denoted as v(k), the summing operation may be represented as $$v(k)=x(k)+x(k-1)+ \ldots +x(k-N+1) \tag{8}$$

and the corresponding Z-domain transfer function as $$H(z)=1+z^{-1}+ \ldots +z^{-(N-1)} \tag{9}$$

which shows that the arrangement of FIGS. 3 and 4 actually corresponds to a Finite Impulse Response (FIR) filter with N taps, with the added feature of sample rate reduction (decimation) after the filter proper. The decimation causes the original spectrum to fold inside the new Nyquist frequency which is N times lower than that of the prior art arrangement of FIG. 2. Fortunately, from the viewpoint of the operation of the system, it can be shown that the transmission zeroes of the FIR filter are located in such a way that no power is aliased to baseband, which means that as long as the band of interest (the signal frequency band) is narrow compared to the Nyquist frequency, the results shown above are valid. FIG. 4a illustrates the transfer function of one such filter with 4 taps; in FIG. 4a the vertical axis corresponds to gain in decibels and the transmission zeroes are clearly visible.

Figure 5:
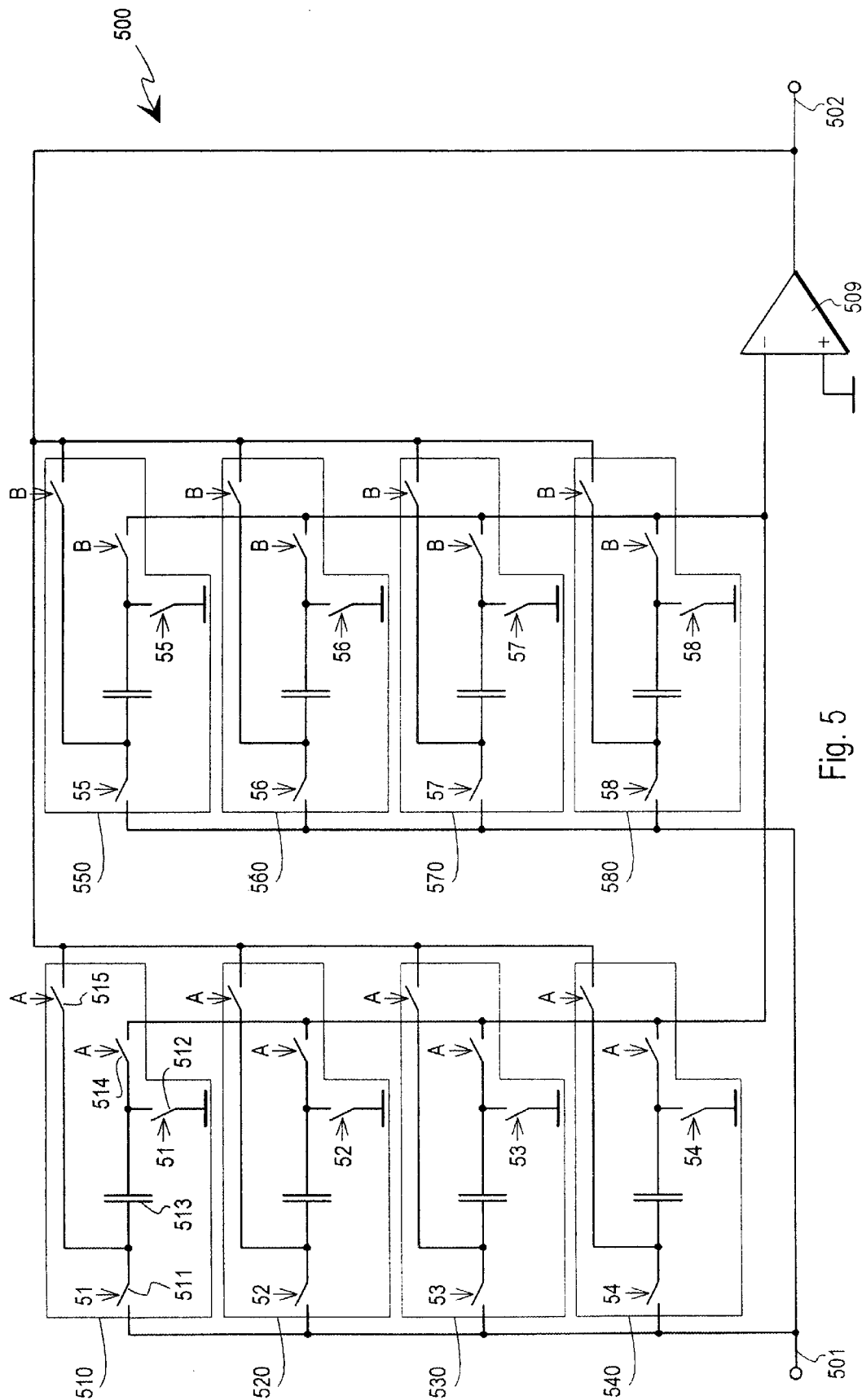
FIG. 5 shows a schematic of a circuit according to the invention.

FIG. 5 illustrates a simplified schematic of a practical circuit 500 that can be used to implement the novel and inventive idea presented above. In FIG. 5 input line 501 corresponds to input line 301 of FIG. 3 and output line 502 corresponds to output line 311 of FIG. 3. Amplifier 509 is easily seen to correspond to amplifier 309 of FIG. 3. For reasons explained below, the circuit of FIG. 5 operates as if it had N=4 even if there are actually 8 separate SC samplers 510 to 580. To describe the structure of an SC sampler in FIG. 5, the first SC sampler 510 is used as an example. The SC sampler 510 comprises two synchronously operating first switches 511 and 512, which together form the sampling switch. The signal that controls the operation of the switches 511 and 512 is denoted as 51. The SC sampler further comprises a capacitor 513 and two synchronously operating second switches 514 and 515, which together form the buffering switch. The signal that controls the operation of the switches 514 and 515 is denoted as A. The control inputs for the signals that open and close the switches are not physically shown. However, it is obvious to the person skilled in the art how such inputs are built into switching arrangements handling high-frequency signals.

Switch 511 is located between the input of the SC sampler 510 and the first plate of the capacitor 513. Switch 512 is located between the second plate of capacitor 513 and ground. Switch 514 is located between the second plate of capacitor 513 and the output of the SC sampler 510 and switch 515 is located between the first plate of capacitor 513 and the output of amplifier 509.

All other SC samplers are similar to the SC sampler 510 described above, with the exception that in SC samplers 550 to 580 a signal B is used to control the buffering switches instead of signal A as in SC samplers 510 to 540. Also, each SC sampler 510 to 580 has its own signal 51 to 58 respectively for controlling the sampling switch.

Figure 6:
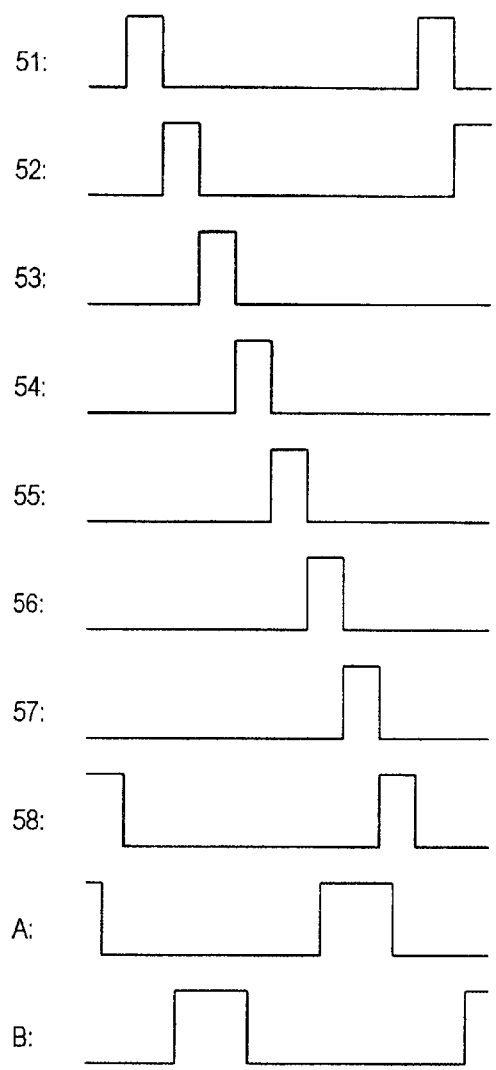
FIG. 6 is a timing diagram concerning the signals in FIG. 5.

FIG. 6 is a timing diagram that shows the mutual relations in time of signals 51 to 58 that control the operation of the sampling switches as well as signals A and B that control the operation of the buffering switches. It is easily seen that the clock pulses that close and open the sampling switches are given consecutively to each SC sampler so that the duration in time of one clock pulse is one fourth of the sampling cycle. The sampling cycle may be understood as the period during which one sample is produced at the output of the buffering component; according to FIG. 6 this happens always after the taking of four consecutive samples at the input. The clock generator goes through eight states during the sampling cycle. The leading edge of the clock pulse for the m:th SC sampler occurs simultaneously with the trailing edge of clock pulse for the (m-1):th sampler, where m goes repeatedly from 1 to 8 and for m=1 it is defined that (m-1)=8. Well after the trailing edge of the clock pulse for SC sampler 540 but simultaneously well before the leading edge of the next clock pulse for SC sampler 510 signal A gives a buffering pulse, causing the samples stored in SC samplers 510 to 540 to be summed and the summing result to be coupled to amplifier 509. At the same time a sampling and storing cycle is on in SC samplers 550 to 580. Again well after the trailing edge of the clock pulse for SC sampler 580 but simultaneously well before the leading edge of the next clock pulse for SC sampler 550 signal B gives a buffering pulse, causing the samples stored in SC samplers 550 to 580 to be summed and the summing result to be coupled to amplifier 509. Here is the reason for using 8 separate SC samplers to emulate N=4; the stored samples from the first group of four SC samplers may be read during an ongoing sampling and storing cycle in the second group of four SC samplers.

To be exact, the circuit of FIG. 5 does not take the sum of the samples at the buffering stage but their mean value. In this case it is conceptually more or less the same because the parallel SC sampler branches are equally weighted in taking the mean value. This invention is not limited in taking the sum or exact mean value of the samples, although the term "sunning" is used for brevity. A more general description of the process would be taking some previously determined combination of the samples.

If the proportional lengths of the sampling pulses on one hand and the buffering pulses on the other hand and their mutual timing is such as in FIG. 6, the minimum number of separate SC samplers that would be required to implement a circuit where the sampling and buffering operations do not take place simultaneously would actually be six; in general to implement the principle of FIG. 3 for any N the minimum number of SC samplers is considered to be 3N/2. The invention does not limit the number of separate SC samplers and their grouping. However, the generation of clock signals is very straightforward with an arrangement of 2N SC samplers arranged in two groups like the two times four SC arrangement in FIG. 5.

The invention does not restrict the exact timing of the buffering operation in relation to the sampling operations, as long as it can be assured that the buffering (the "reading" of the samples) does not interfere with the sampling itself.

Figure 7:
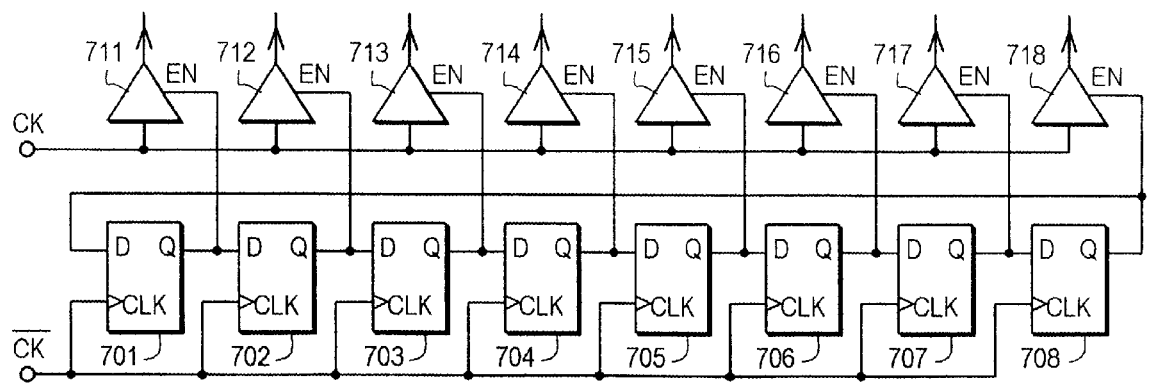
FIG. 7 shows a clock signal generator used in connection with the invention.

The invention does not restrict the generation of clock signals for the SC samplers. FIG. 7 shows one exemplary way of producing clock signals to eight SC samplers.

The clock signal generator 700 comprises eight D-flipflops 701 to 708 in series and eight switch drivers 711 to 718 connected so that each D-flipflop provides the enabling signal EN to one switch driver from its output Q. The output Q of each D-flipflop is also coupled to the input D of the next D-flipflop and the output Q of the last D-flipflop 708 is coupled to the input D of the first D-flipflop 701. A clock signal CK is coupled to the signal input of the switch drivers 711 to 718 and the inverse $\overline{CK}$ of the clock signal is coupled to the clock input CLK of the D-flipflops 701 to 708. At the output of each switch driver 711 to 718 a clock signal for one SC sampler is obtained. The flip-flops must be initialized during a reset period so that one of them is set to logical '1' and the others are set to logical '0'.

The input frequency that will be sampled with a sampling mixer may be limited by other aspects than the achievable clock frequency that was discussed previously. If a prior art sampling mixer according to FIG. 2 is used to downconvert a very high intermediate frequency, the nonlinear switch resistance or the nonlinear switch capacitances inherently associated with the high-frequency switch 203 may give rise to unacceptable distortion in the sampler track-mode. Therefore it may be desirable to use the lowest possible IF determined by the system requirements and raise the sampling frequency above the IF. However, in this case downconversion to baseband can no longer be performed by sampling with a conventional arrangement.

Figure 8:
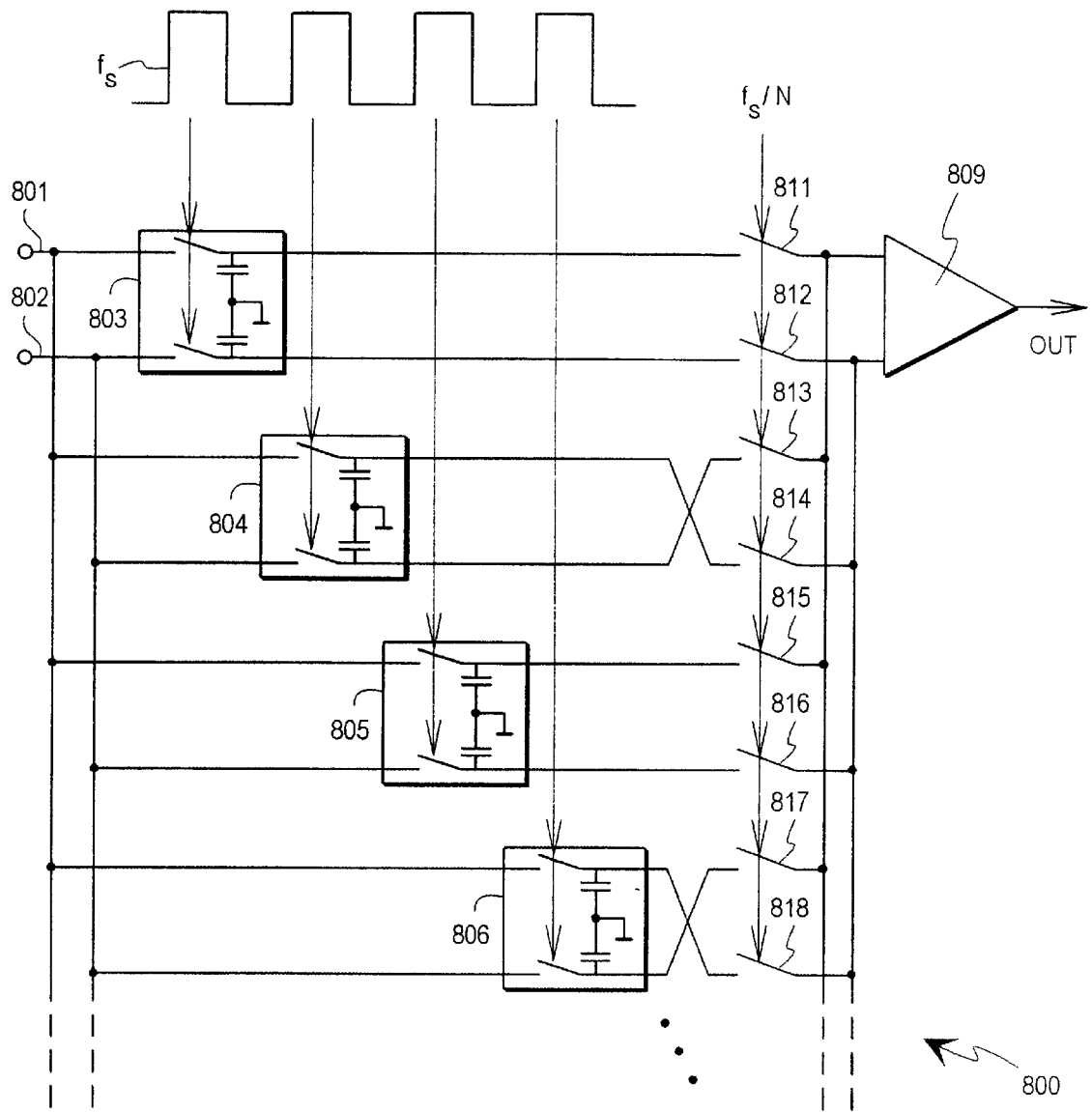
FIG. 8 illustrates the principle of an advantageous further application of the invention.

As a solution, a further application of the basic inventive idea described above may be presented. This further application is based on the suitable multiplication (advantageously inversion) of selected samples before summing them together with the rest of the samples. FIG. 8 illustrates this principle applied to a circuit arrangement which has the additional feature that all signals are differential; the considerations of differential signals can as such be applied also to the arrangements according to FIGS. 3 and 5. Inverting a number of selected samples is especially easy when the signals are in differential form, but the general idea of inverting does not require the signals to be differential.

Figure 8A:
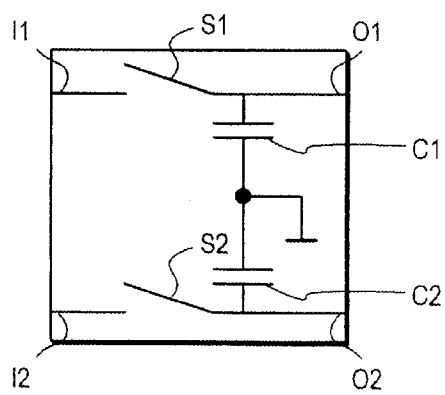
FIG. 8a is a detail from FIG. 8.

The circuit arrangement 800 of FIG. 8 comprises a differential input consisting of a first input line 801 and a second input line 802 for inputting a signal as an oscillating potential difference between the two input lines. According to the basic inventive idea described above there are N parallel SC samplers connected to the input lines 801 and 802, of which only SC samplers 803 to 806 are shown. The internal structure of an SC sampler is illustrated more closely in FIG. 8a. The SC samplers have two inputs I1 and I2 and two outputs O1 and O2 for handling differential signals. In each SC sampler there are two switches S1 and S2, each one of them being located between one input and the corresponding output. Each SC sampler also comprises two capacitors C1 and C2, each one of them being located between one output and a constant reference potential, which is most advantageously the ground potential. The two switches S1 and S2 function synchronously with each other as a response to a first control signal.

The circuit arrangement 800 additionally comprises 2N buffering switches of which only buffering switches 811 to 818 are shown. All buffering switches operate synchronously with each other as a response to a second control signal. The buffering switches are arranged in pairs so that buffering switches 811 and 812 are coupled between the outputs of SC sampler 803 and the inputs of buffering amplifier 809, buffering switches 813 and 814 are coupled between the outputs of SC sampler 804 and the inputs of buffering amplifier 809 and so on.

The currently discussed further application of the invention resides in the cross-connection of output wires of every other SC sampler. In FIG. 8 the output wires of SC samplers 804 and 806 are cross-connected, meaning that the second output of each of these SC samplers is coupled—via the respective buffering switch—to the first input of amplifier 809 and the first output of the SC sampler is coupled—via the respective buffering switch—to the second input of amplifier 809. It has no importance whether the cross-connection takes physically place before or after the buffering switches. The inversion of the samples may be done even before sampling but this may introduce mismatch between signal paths.

The roles of the first and second control signals in FIG. 8 are the same as those of the first and second clock signals in FIG. 3. Namely, the first control signal contains regular clock pulses at a relatively high frequency, and a clocking arrangement not shown in FIG. 8 will arrange the conduction of said clock pulses cyclically so that during a sampling cycle of N consecutive clock pulses each SC sampler will receive a clock pulse of its own. After the sampling cycle has been completed, a pulse in the second control signal will close the buffering switches, whereby the sum of the samples collected in the SC samplers is read into the buffering amplifier. For enabling continuous sampling that does not interfere with the buffering, many kinds of groupings of the SC samplers is possible; reference is made here to the exemplary grouping of two times four in FIG. 5.

The use of two capacitors in each SC sampler with differential input and output as in FIG. 8 is customary in SC circuit design because it doubles the dynamic range and improves greatly the PSRR and CMRR of the circuits.

Many modem telecommunication systems use some quadrature modulation schemes, which make it necessary to produce two Local Oscillator (LO) signals in the receiver at the same frequency but a mutual phase shift of exactly $\pi/2$ radians. Setting the sampling frequency (the frequency of the first control signal) in FIG. 8 at exactly two times the frequency of the input signal is particularly convenient, because then a phase shift of $\pi$ radians in the sampling frequency corresponds to a phase shift of $\pi/2$ radians in the input frequency. As a result, IQ-phasing may be generated simply by sampling at four times the input frequency and passing every even sample to the I-branch and every odd sample to the Q-branch of the receivers.

Figure 9:
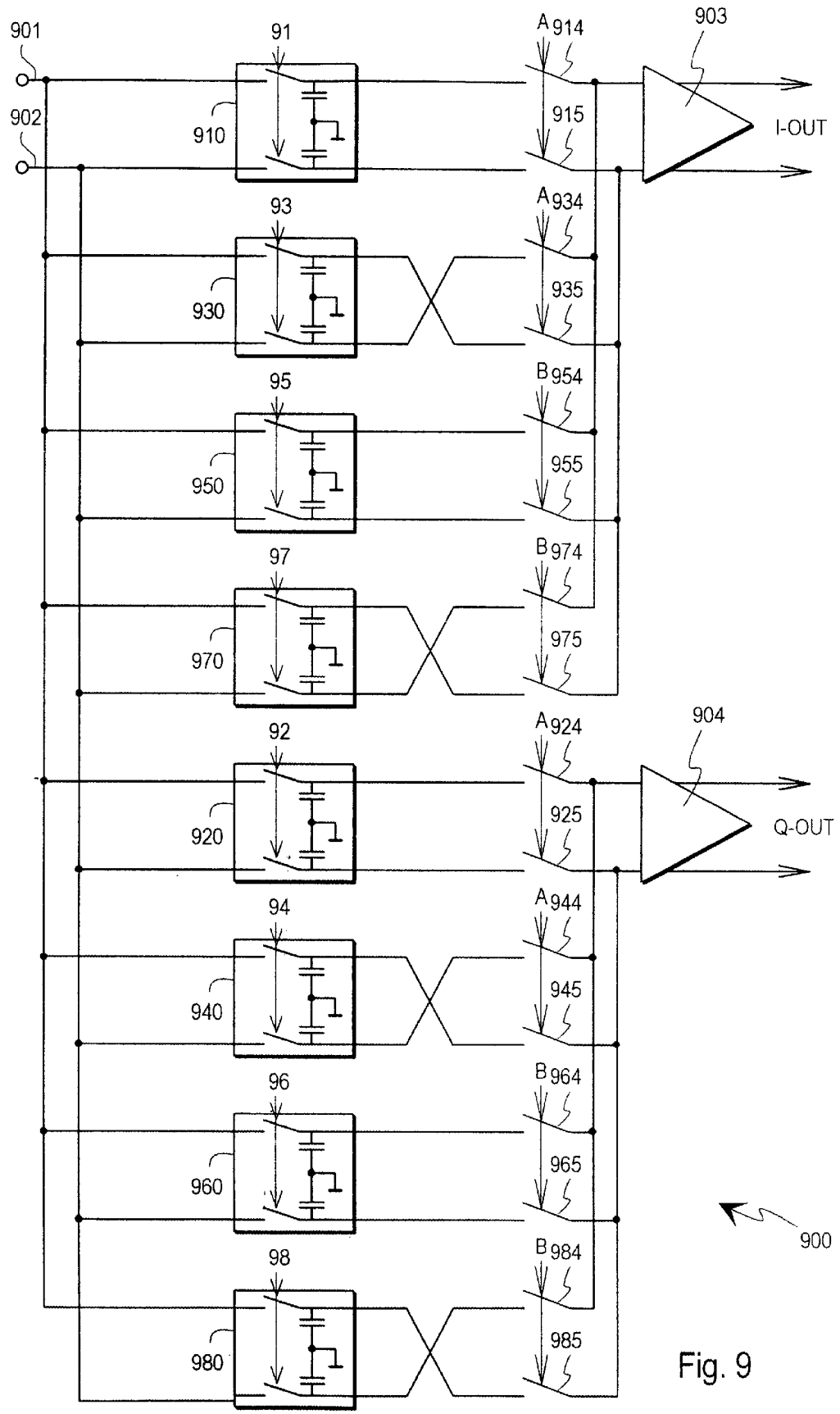
FIG. 9 is a schematic of a circuit according to the further application of the invention

The above-explained principle is illustrated in FIG. 9, which depicts a practical circuit arrangement that can be used to implement the currently discussed further application of the invention. The circuit arrangement 900 comprises two physical input lines 901 and 902 which are, as in FIG. 8, actually only the two halves of a single logical input line for differential signals. In this embodiment there are eight SC samplers 910 to 980, but is has to be noted that the previous disclaimers about the invention not limiting the number of parallel SC samplers again apply. The SC samplers 910, 930, 950 and 970 belong to the I-branch group and the SC samplers 920, 940, 960 and 980 belong to the Q-branch group; if the concept of FIG. 9 is generalised to include any number of parallel SC samplers, it is most advantageous that there are always as many SC samplers in the I-branch group as in the Q-branch group and that the number of SC samplers in each group is even, although this is not necessary. The internal structure of the SC samplers is identical to that described above in connection with FIGS. 8 and 8a. Each SC sampler has two inputs (i.e . a differential input) which are connected to input lines 901 and 902. Each SC sampler has also two outputs (i.e. a differential output).

The outputs of the SC samplers in the I-branch group are coupled—via their respective buffering switches—to the inputs of the I-branch buffering amplifier 903 and the outputs of the SC samplers in the Q-branch group are coupled—via their respective buffering switches—to the inputs of the Q-branch buffering amplifier 904. The outputs of the SC samplers 930, 970, 940 and 980 are cross-connected before coupling them to the inputs of the respective buffering amplifiers. In FIG. 9 the cross-connection takes place physically before the buffering switches; it could as well take place between the buffering switches and the buffering amplifiers.

Figure 10:
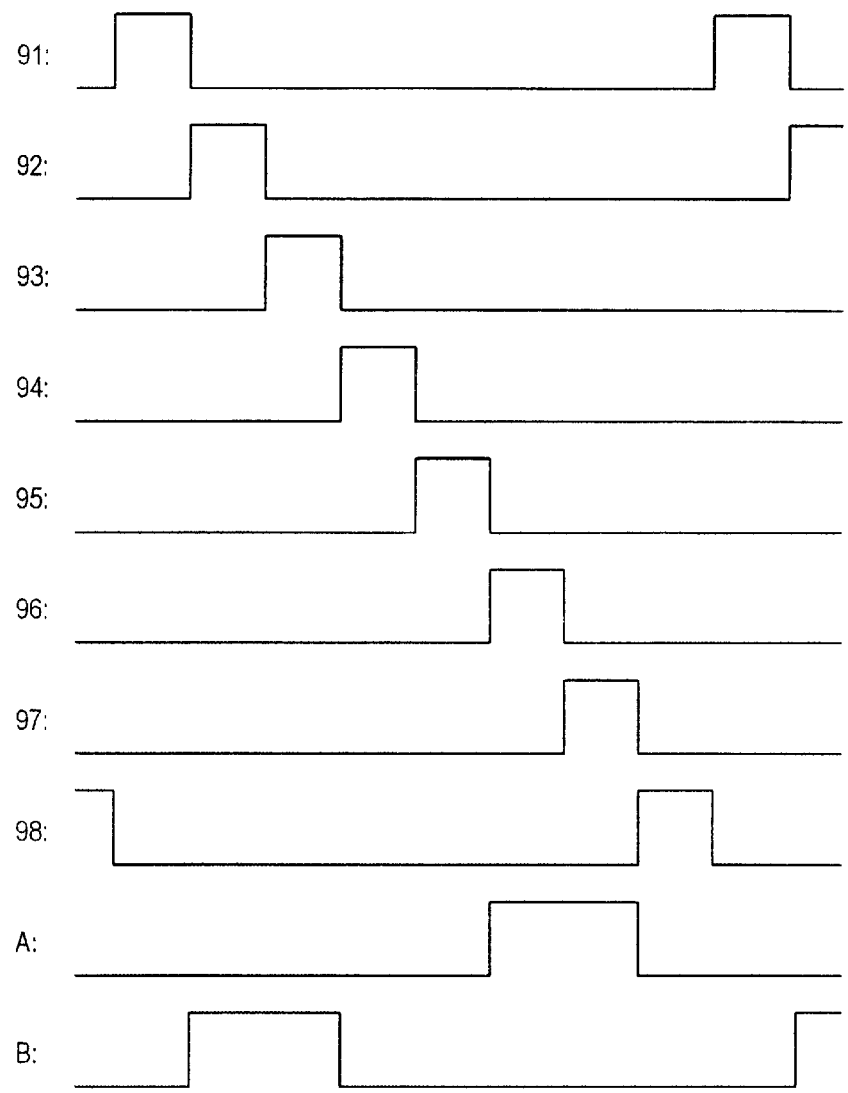
FIG. 10 is a timing diagram concerning the signals in FIG. 9

A first buffering signal A is used to control the operation of the buffering switches 914, 915, 934, 935, 924, 925, 944 and 945. A second buffering signal B is used to control the operation of the buffering switches 954, 955, 974, 975, 964, 965, 984 and 985. The first control signals that control the operation of the sampling switches in SC samplers 910 to 980 are numbered from 91 to 98 respectively. The timing diagram of FIG. 10 illustrates the mutual timing of the control signals. The sampling time base, from which the control signals 91 to 98 are derived, has the frequency of four times the input frequency, and the buffering frequency time base, from which the control signals A and B are derived, has the same frequency as the input frequency. With "input frequency" it is meant the frequency of interest that is coupled to input lines 901 and 902 during the operation of the circuit. If the apparatus of FIG. 9 is used for downconversion from intermediate frequency to baseband, the input frequency is the same as the intermediate frequency.

Let us assume that the input frequency is an intermediate frequency in a radio receiver. By inspecting the timing diagram of FIG. 10 it can be seen that in this advantageous embodiment of the invention the sampling frequency seen in each branch (I or Q branch) alone is two times the intermediate frequency, which relaxes the anti-alias filtering and sampling jitter requirements as discussed previously. The sampling clock or any of its harmonics do not operate on the LO frequency and it is located out of the antialias filter passband. The driving circuit sees similar disturbances from the I- and Q sampling clocks which results in good IQ-balance. Additionally, any DC-component passing the sampler (coming with the IF signal or generated by the sampler arrangement) is blocked by the transmission zero at DC.

The same technique can be used in a subsampling mixer converting a bandlimited RF signal to baseband. The RF signal would be first converted to IF by sampling and immediately moved to baseband by the subsequent decimation operation. This kind of downconversion could be called quasi-direct, because there would be no analogue signal processing (filtering or amplification) at the IF. The RF signal in the sampler input would be converted directly to baseband in the cross-coupled sampling downconverter block, and the rest of the signal processing could be done at the baseband. A similar image problem should be accounted for as in a superheterodyne receiver.

The further application discussed above with reference to FIGS. 8–10 is not limited to just inverting selected samples. The fundamental idea of the further application is to modify the coefficients determining the FIR transfer function. This way the transmission zeroes can be chosen so that during decimation only a narrow frequency band folds down to DC. The coefficients need thus not be exactly −1 and 1 as in the inversion case, although that is an advantageous selection of coefficients because it masses the conversion gain. Additionally the relation of the clock frequency to the intermediate frequency does not need to be an even number. Downconverting for example from a frequency that is one third of the Nyquist frequency, taking the coefficients to be 0.5, −1 and 0.5 and decimating by three would be one working solution. In practice this would mean that there would be three sampling capacitances, the middle one of them being twice the size of the two others, and the sample taken by the middle capacitance would be inverted. In such a case the maximum of the transfer function would not be on the frequency that is downconverted.

Figure 11:
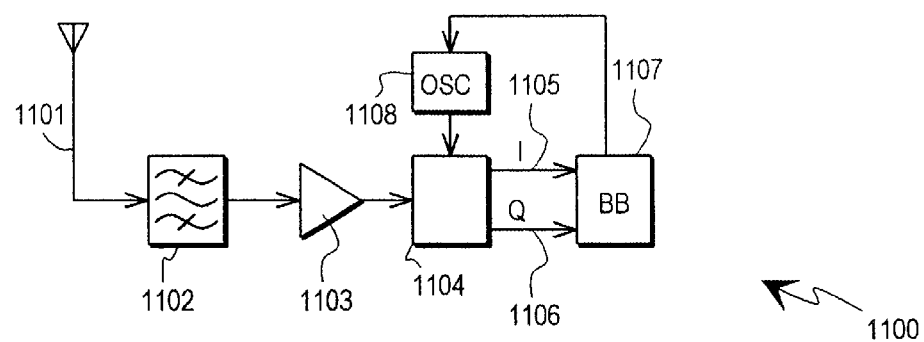
FIG. 11 illustrates a receiver according to the invention.

FIG. 11 illustrates a receiver 1100 where the present invention is utilized. A radio frequency signal picked up by the antenna 1101 is filtered in a band pass filter 1102 and amplified in a Low Noise Amplifier (LNA) 1103 before conducting it to a cross-coupled sampling downconverter block 1104 according to the invention. The output from block 1103 is a baseband signal on two branches 1105 and 1106. It is conducted to a baseband signal processing block 1107 which can be a known baseband block with any combination of the known functions for reconstructing the information content of a received signal and possibly presenting it to a user in the form of audible signal and/or on a display. Oscillator block 1108 provides the cross-coupled sampling downconverter block 1104 with the necessary clock signals and it may operate under the control of a microprocessor included in the baseband signal processing block 1107.

The inventive idea presented above, namely the sampling of a signal with a high sampling frequency and latching the samples into a buffering component with a lower frequency, could in principle be realised with an alternative approach where only a single SC sampler would be used to sample the signal. A number of successive samples would be then collected into an "intermediate storage" between the SC sampler and a following buffering amplifier. When N samples had been collected, the accumulated contents of the intermediate storage would be latched to the buffering amplifier, the intermediate storage would be emptied and a new sampling cycle would be started. The problem of this approach would be the summing of the signals in the intermediate storage. The only passive storage available is a capacitance, but a tank capacitance would not store a sum of the samples but their average, and even then the relative weights of the samples would increase towards the end of the sampling cycle. No transmission zeroes would be generated in the Z-domain transfer function; transmission zeroes of this kind are important because they guarantee that there will be no unwanted frequency folding during the decimation procedure. An active intermediate storage (such as an integrator) would consume power offsetting the benefits otherwise obtained.

What is claimed is:

1. Electrical circuit for sampling an input signal having a certain input frequency and converting the input signal into a certain output frequency, the output frequency being lower than the input frequency, comprising an input and an output, a first sampler circuit coupled to the input, a second sampler circuit coupled to the input, a buffering component coupled to the output and buffer switching means between said first and second sampler circuits and said buffering component;

wherein said buffer switching means are arranged to respond to a buffering command by coupling said first sampler circuit and said second sampler circuit to said buffering component.

2. Electrical circuit according to claim 1, comprising N sampler circuits coupled to the input, N being a positive integer greater than 2, whereby said buffer switching means are arranged to respond to said buffering command by coupling said N sampler circuits to said buffering component.

3. Electrical circuit according to claim 1 adapted for continuous sampling of the input signal by sampler circuits coupled to the input and comprising a first sampling group consisting of a predetermined number of sampler circuits coupled to the input, a second sampling group consisting of a predetermined number of sampler circuits coupled to the input, first buffer switching means arranged to respond to a first buffering command by coupling the sampler circuits of said first sampling group to said buffering component and second buffer switching means arranged to respond to a second buffering command by coupling the sampler circuits of said second sampling group to said buffering component.

4. Electrical circuit according to claim 1, wherein each sampler circuit comprises a sampler input, a sampler output, a sampling command input and a buffering command input, a sampling capacitance arranged to store a sample from a signal coupled to said sampler input and to provide a stored sample to the sampler output and switching means arranged to respond to sampling commands brought into said sampling command input and buffering commands brought into said buffering command input and having a first state, a second state and a third state, of which said first state corresponds to a tracking mode of the sampler wherein a sample is taken from a signal coupled to said sampler input and said second state corresponds to a hold mode of the sampler wherein a sample taken in said first state is stored in the sampler and said third state corresponds to an output mode of the sampler wherein a stored sample is provided to said sampler output.

5. Electrical circuit according to claim 1, wherein each sampler circuit comprises a differential sampler input consisting of a first input line and a second input line, a differential sampler output consisting of a first output line and a second output line, a sampling command input, a first sampling capacitance and a second sampling capacitance arranged to store a differential sample from a signal coupled to said sampler input and to provide a stored differential sample to the sampler output and sampler switching means arranged to respond to sampling commands brought into said sampling command input and having a first state and a second state, of which said first state corresponds to a tracking mode of the sampler wherein a differential sample is taken from a signal coupled to said sampler input and said second state corresponds to a hold mode of the sampler wherein a stored differential sample is provided to said sampler output.

6. Electrical circuit according to claim 5, additionally comprising a differential circuit input consisting of a first input line and a second input line, means for coupling the first input line of each differential sampler input to the first input line of said differential circuit input, means for coupling the second input line of each differential sampler input to the second input line of said differential circuit input, a differential buffering component with a first input line and a second input line, and within said buffer switching means, means arranged to respond to a buffering command by coupling the first output line of the differential sampler output of the first sampler circuit to the first input line of said differential buffering component and the second output line of the differential sampler output of the first sampler circuit to the second input line of said differential buffering component and coupling the first output line of the differential sampler output of the second sampler circuit to the second input line of said differential buffering component and the second output line of the differential sampler output of the second sampler circuit to the first input line of said differential buffering component.

7. Electrical circuit according to claim 5, additionally comprising a differential circuit input consisting of a first input line and a second input line, in an I-branch sampler group, a first sampler circuit and a second sampler circuit, in a Q-branch sampler group, a third sampler circuit and a fourth sampler circuit, means for coupling the first input line of each differential sampler input to the first input line of said differential circuit input, means for coupling the second input line of each differential sampler input to the second input line of said differential circuit input, an I-branch differential buffering component with a first input line and a second input line, a Q-branch differential buffering component with a first input line and a second input line, and within said buffer switching means, means arranged to respond to a first buffering command by coupling the first output line of the differential sampler output of the first sampler circuit to the first input line of said I-branch differential buffering component, coupling the second output line of the differential sampler output of the first sampler circuit to the second input line of said I-branch differential buffering component, coupling the first output line of the differential sampler output of the third sampler circuit to the first input line of said Q-branch differential buffering component and coupling the second output line of the differential sampler output of the third sampler circuit to the second input line of said Q-branch differential buffering component and means arranged to respond to a second buffering command by coupling the first output line of the differential sampler output of the second sampler circuit to the second input line of said I-branch differential buffering component, coupling the second output line of the differential sampler output of the second sampler circuit to the first input line of said I-branch differential buffering component, coupling the first output line of the differential sampler output of the fourth sampler circuit to the second input line of said Q-branch differential buffering component and coupling the second output line of the differential sampler output of the fourth sampler circuit to the first input line of said Q-branch differential buffering component.

8. Receiver for receiving radio frequency signals, comprising a sampling downconverter block for implementing the downconversion of the received signals from a first frequency to a second frequency which is lower than the first frequency, within the sampling downconverter block a first sampler circuit coupled to the input of the sampling downconverter block, also within the sampling downconverter block a second sampler circuit coupled to the input of the sampling downconverter block, also within the sampling downconverter block a buffering component coupled to the output of the sampling downconverter block and also within the sampling downconverter block buffer switching means arranged to respond to a buffering command by coupling said first sampler circuit and said second sampler circuit to said buffering component.

9. Receiver according to claim 8, comprising a radio frequency part and a baseband part, wherein the sampling downconverter block is located between the radio frequency part and the baseband part for converting the received signals from radio frequency to baseband frequency.

10. Receiver according to claim 8, comprising a radio frequency part, an intermediate frequency part and a baseband part, wherein the sampling downconverter block is located between the intermediate frequency part and the baseband part for converting the received signals from an intermediate frequency to baseband frequency.

11. Method for sampling an input signal having a certain input frequency and converting the input signal into a certain output frequency, the output frequency being lower than the input frequency, comprising the steps of taking a first sample from the input signal during a first sampling time interval and holding said first sample, taking a second sample from the input signal during a second sampling time interval, which is later in time than said first sampling time interval, and holding said second sample, taking a predetermined combination of said held first sample and said held second sample and buffering said predetermined combination in an output buffer.

12. Method according to claim 11, comprising a repeatedly performed sampling cycle, wherein during each sampling cycle N consecutive samples are taken from the input signal and held separately, where N is a positive integer greater than 2, and further during each sampling cycle a predetermined combination of said N consecutive samples is taken, and said predetermined combination is buffered in an output buffer for the duration of the next sampling cycle.

13. Method according to claim 11, comprising a repeatedly performed sampling cycle consisting of a first part and a second part, wherein during the first part of each sampling cycle N consecutive samples are taken from the input signal and held separately, where N is a positive integer, during the second part of each sampling cycle M consecutive samples are taken from the input signal and held separately, where M is a positive integer, during the first part of each sampling cycle a predetermined combination of the M consecutive samples taken during the second part of the previous sampling cycle is taken and buffered in an output buffer and during the second part of each sampling cycle a predetermined combination of the N consecutive samples taken during the first part of the same sampling cycle is taken and buffered in an output buffer.

14. Method according to claim 11, wherein before taking said predetermined combination of said held first sample and said held second sample, said second sample is inverted.

15. Method according to claim 11, comprising a repeatedly performed sampling cycle consisting of a first part and a second part, wherein during said first part it comprises said steps of taking a first sample and a second sample and additionally the steps of taking a third sample from the input signal during a third sampling time interval, which is later in time than said second sampling time interval, and inverting and holding said third sample, taking a fourth sample from the input signal during a fourth sampling time interval, which is later in time than said third sampling time interval, and inverting and holding said fourth sample, and during said second part it comprises said steps of taking a fifth sample from the input signal during a fifth sampling time interval, which is later in time than said fourth sampling time interval, and holding said fifth sample, taking a sixth sample from the input signal during a sixth sampling time interval, which is later in time than said fifth sampling time interval, and holding said sixth sample, taking a seventh sample from the input signal during a seventh sampling time interval, which is later in time than said sixth sampling time interval, and inverting and holding said seventh sample, and taking an eighth sample from the input signal during an eighth sampling time interval, which is later in time than said seventh sampling time interval, and inverting and holding said eighth sample, and during the first part of each sampling cycle it additionally comprises the steps of taking a predetermined combination of the fifth sample and inverted seventh sample taken during the second part of the previous sampling cycle and buffering said predetermined combination in a first output buffer and taking the a predetermined combination of the sixth sample and inverted eighth sample taken during the second part of the previous sampling cycle and buffering said predetermined combination in a second output buffer, and during the second part of each sampling cycle it additionally comprises the steps of taking a predetermined combination of the first sample and inverted third sample taken during the first part of the same sampling cycle and buffering said predetermined combination in a first output buffer and taking a predetermined combination of the second sample and inverted fourth sample taken during the first part of the same sampling cycle and buffering said predetermined combination in a second output buffer.

16. Method according to claim 15, wherein the input frequency is an intermediate frequency in a receiver, the sampling frequency corresponding to the taking of said first, third, fifth and seventh samples is the same as the sampling frequency corresponding to the taking of said second, fourth, sixth and eighth samples, which is four times said intermediate frequency, and the frequency of buffering the predetermined combinations of said samples is the same as said intermediate frequency.

17. Electrical circuit for sampling an input signal having a certain input frequency and converting the input signal into a certain output frequency, the output frequency being lower than the input frequency, comprising:

an input and an output;

a first sampler circuit coupled to the input;

a second sampler circuit coupled to the input;

a buffering component coupled to the output; and buffer switching means between said first and second sampler circuits and said buffering component;

wherein said buffer switching means are arranged to respond to a buffering command by coupling said first sampler circuit and said second sampler circuit to said buffering component;

and wherein each sampler circuit comprises:

a differential sampler input consisting of a first input line and a second input line, a differential sampler output consisting of a first output line and a second output line;

a sampling command input;

a first sampling capacitance and a second sampling capacitance arranged to store a differential sample from a signal coupled to said sampler input and to provide a stored differential sample to the sampler output, and sampler switching means arranged to respond to sampling commands brought into said sampling command input and having a first state and a second state, of which said first state corresponds to a tracking mode of the sampler wherein a differential sample is taken from a signal coupled to said sampler input and said second state corresponds to a hold mode of the sampler wherein a stored differential sample is provided to said sampler output.

18. Electrical circuit according to claim 17, additionally comprising a differential circuit input consisting of a first input line and a second input line;

means for coupling the first input line of each differential sampler input to the first input line of said differential circuit input;

means for coupling the second input line of each differential sampler input to the second input line of said differential circuit input, a differential buffering component with a first input and a second input line, and within said buffer switching means, means arranged to respond to a buffering command by coupling the first output line of the differential sampler output of the first sampler circuit to the first input line of said differential buffering component and the second output line of the differential sampler output of the first sampler circuit to the second input line of said differential buffering component, and coupling the first output line of the differential sampler output of the second sampler circuit to the second input line of said differential buffering component and the second output line of the differential sampler output of the second sampler circuit to the first input line of said differential buffering component.

19. Electrical circuit according to claim 17, additionally comprising:

a differential circuit input consisting of a first input line and a second input line, in an I-branch sampler group, a first sampler circuit and a second sampler circuit, in a Q-branch sampler group, a third sampler circuit and a fourth sampler circuit, means for coupling the first input line of each differential sampler input to the first input line of said differential circuit input, means for coupling the second input line of each differential sampler input to the second input line of said differential circuit input, an I-branch differential buffering component with a first input line and a second input line, a Q-branch differential buffering component with a first input line and a second input line, and within said buffer switching means, means arranged to respond to a first buffering command by coupling the first output line of the differential sampler output of the first sampler circuit to the first input line of said I-branch differential buffering component, coupling the second output line of the differential sampler output of the first sampler circuit to the second input line of said I-branch differential buffering component, coupling the first output line of the differential sampler output of the third sampler circuit to the first input line of said Q-branch differential buffering component and coupling the second output line of the differential sampler output of the third sampler circuit to the second input line of said Q-branch differential buffering component, and means arranged to respond to a second buffering command by coupling the first output line of the differential sampler output of the second sampler circuit to the second input line of said I-branch differential buffering component, coupling the second output line of the differential sampler output of the second sampler circuit to the first input line of said I-branch differential buffering component, coupling the first output line of the differential sampler output of the fourth sampler circuit to the second input line of said Q-branch differential buffering component and coupling the second output line of the differential sampler output of the fourth sampler circuit to the first input line of said Q-branch differential buffering component.

20. Method for sampling an input signal having a certain input frequency and converting the input signal into a certain output frequency, the output frequency being lower than the input frequency, comprising the steps of:

taking a first sample from the input signal during a first sampling time interval and holding said first sample, taking a second sample from the input signal during a second sampling time interval, which is later in time than said first sampling time interval, and holding said second sample, taking a predetermined combination of said held first sample and said held second sample, and buffering said predetermined combination in an output buffer, a repeatedly performed sampling cycle consisting of a first part and a second part, wherein during said first part it comprises said steps of taking a first sample and a second sample and additionally the steps of taking a third sample from the input signal during a third sampling time interval, which is later in time than said second sampling time interval, and inverting and holding said third sample, taking a fourth sample from the input signal during a fourth sampling time interval, which is later in time than said third sampling time interval, and inverting and holding said fourth sample, and during said second part it comprises said steps of taking a fifth sample from the input signal during a fifth sampling time interval, which is later in time than said fourth sampling time interval, and holding said fifth sample, taking a sixth sample from the input signal during a sixth sampling time interval, which is later in time than said fifth sampling time interval, and holding said sixth sample, taking a seventh sample from the input signal during a seventh sampling time interval, which is later in time than said sixth sampling time interval, and inverting and holding said seventh sample, and taking an eighth sample from the input signal during an eighth sampling time interval, which is later in time than said seventh sampling time interval, and inverting and holding said eighth sample, and during the first part of each sampling cycle it additionally comprises the steps of taking a predetermined combination of the fifth sample and inverted seventh sample taken during the second part of the previous sampling cycle and buffering said predetermined combination in a first output buffer, and taking a predetermined combination of the sixth sample and inverted eighth sample taken during the second part of the previous sampling cycle and buffering said predetermined combination in a second output buffer, and during the second part of each sampling cycle it additionally comprises the steps of:

taking a predetermined combination of the first sample and inverted third sample taken during the first part of the same sampling cycle and buffering said predetermined combination in a first output buffer; and taking a predetermined combination of the second sample and inverted fourth sample taken during the first part of the same sampling cycle and buffering said predetermined combination in a second output buffer.

21. Method according to claim 20, wherein the input frequency is an intermediate frequency in a receiver, the sampling frequency corresponding to the taking of said first, third, fifth and seventh samples is the same as the sampling frequency corresponding to the taking of said second, fourth, sixth and eighth samples, which is four times said intermediate frequency, and the frequency of buffering the predetermined combinations of said samples is the same as said intermediate frequency.

* * * * *